United States Patent
Grupp et al.

(10) Patent No.: US 11,489,466 B2
(45) Date of Patent: Nov. 1, 2022

(54) METHOD AND DEVICE FOR CHECKING AN ELECTRICAL VALUE OF AN ELECTRIC MACHINE

(71) Applicant: CARL ZEISS INDUSTRIELLE MESSTECHNIK GMBH, Oberkochen (DE)

(72) Inventors: Guenter Grupp, Boehmenkirch (DE); Otto Ruck, Ellwangen (DE); Peter Uhl, Unterschneidheim (DE); Thomas Maier, Aalen (DE)

(73) Assignee: CARL ZEISS INDUSTRIELLE MESSTECHNIK GMBH, Oberkochen (DE)

(*) Notice: Subject to any disclaimer, the term of this patent is extended or adjusted under 35 U.S.C. 154(b) by 747 days.

(21) Appl. No.: 15/848,282

(22) Filed: Dec. 20, 2017

(65) Prior Publication Data

US 2018/0159448 A1 Jun. 7, 2018

Related U.S. Application Data

(63) Continuation of application No. PCT/EP2016/061669, filed on May 24, 2016.

(30) Foreign Application Priority Data

Jun. 24, 2015 (DE) .................... 10 2015 110 174.2

(51) Int. Cl.
*H02P 6/12* (2006.01)
*G01B 5/008* (2006.01)
(Continued)

(52) U.S. Cl.
CPC ............... *H02P 6/12* (2013.01); *G01B 5/008* (2013.01); *G01R 21/133* (2013.01); *H02P 6/08* (2013.01);
(Continued)

(58) Field of Classification Search
CPC .......... H02P 29/0241; H02P 6/08; H02P 6/12; H02P 23/0022; G01B 5/008; G01B 21/047; G01R 21/133
(Continued)

(56) References Cited

U.S. PATENT DOCUMENTS 8,232,756 B2 * 7/2012 Yoshihara ................ B60K 6/48
318/434
2005/0218849 A1 10/2005 Sanglikar et al.
(Continued)

FOREIGN PATENT DOCUMENTS

DE 102006003362 A1 7/2007
DE 102006009181 A1 9/2007
(Continued)

OTHER PUBLICATIONS

International Search Report for PCT/EP2016/061669; dated Aug. 16, 2016; 2 pp.
(Continued)

*Primary Examiner* — Muhammad S Islam
*Assistant Examiner* — Zemenay T Truneh
(74) *Attorney, Agent, or Firm* — Miller, Johnson, Snell & Cummiskey, P.L.C.

(57) ABSTRACT

The invention relates to a method for checking an electrical value of an electric machine, in particular an electric machine of a coordinate measuring device. The electric machine has an electric drive comprising a stator and a rotor. The method includes the steps of: detecting a value of a drive current delivered to the electric drive for driving the rotor, detecting a measured value of an electrical input variable of the electric machine, determining a calculated value of the electrical input variable on the basis of the detected value of the drive current and on the basis of a performance model of the electric machine, and determining
(Continued)

a comparison value on the basis of the detected measured value and the calculated value of the electrical input variable, in order to check the detected value of the drive current.

20 Claims, 4 Drawing Sheets

(51) Int. Cl.
      *G01R 21/133*     (2006.01)
      *H02P 6/08*     (2016.01)
      *H02P 29/024*     (2016.01)
      *H02P 23/00*     (2016.01)
      *H02M 1/00*     (2006.01)
      *G01B 21/04*     (2006.01)

(52) U.S. Cl.
      CPC ...... *H02P 23/0022* (2013.01); *H02P 29/0241* (2016.02); *G01B 21/047* (2013.01); *H02M 1/0009* (2021.05)

(58) Field of Classification Search
      USPC ........................................ 318/400.15; 33/503
      See application file for complete search history.

(56) References Cited

U.S. PATENT DOCUMENTS

| | | | |
|---|---|---|---|
| 2008/0094762 A1 | 4/2008 | Ochiai | |
| 2008/0295349 A1* | 12/2008 | Uhl | .............. G01B 21/047 33/503 |
| 2009/0026995 A1 | 1/2009 | Uhl et al. | |
| 2013/0334995 A1* | 12/2013 | Kuroda | ............... B62D 5/0493 318/400.27 |
| 2014/0184125 A1* | 7/2014 | Fu | ........................ H02P 21/20 318/490 |

FOREIGN PATENT DOCUMENTS

| | | |
|---|---|---|
| DE | 102011075387 A1 | 11/2012 |
| DE | 102011089039 A1 | 6/2013 |
| DE | 102011089061 A1 | 6/2013 |
| EP | 2063333 A1 | 5/2009 |
| GB | 2003281 A | 3/1979 |

OTHER PUBLICATIONS

English translation of International Preliminary Report on Patentability (Chapter II) for PCT/EP2016/061669; 11 pp.

* cited by examiner

METHOD AND DEVICE FOR CHECKING AN ELECTRICAL VALUE OF AN ELECTRIC MACHINE

CROSS-REFERENCES TO RELATED APPLICATIONS

This application is a continuation of international patent application PCT/EP2016/061669 filed on May 24, 2016 designating the U.S., which international patent application claims priority from German patent application DE 10 2015 110 174.2 filed on Jun. 24, 2015. The entire contents of these priority applications are incorporated herein by reference.

BACKGROUND OF THE INVENTION

The present invention relates to a method for checking an electrical variable of an electric machine, in particular an electric machine of a coordinate measuring machine, wherein the electric machine has an electric drive having a stator and a rotor.

The invention further relates to an apparatus for checking an electrical variable of an electric machine, in particular an electric machine of a coordinate measuring machine, wherein the electric machine has an electric drive having a stator and a rotor.

The present invention further relates to a method for operating an electric machine.

The present invention finally relates to an electric machine having an electric drive, which has a stator and a rotor, and having a control unit for actuating or energizing the electric drive.

It is generally known from the technical field of electric drives that the motor current as an electrical variable is proportional to a motor force for linear motors and to a motor torque for rotary motors. The relationship between said electrical variable and the mechanical variable is given by a drive-specific characteristic variable. For the precise and safe control of electric drives it is therefore necessary to reliably detect the motor current as a measurement variable for determining or for limiting motor forces or motor torques and to provide said motor current for the control of the motor. For reliable measurement of the motor current in this way it is usually necessary to redundantly detect the motor current, in order to achieve the appropriate level of safety.

A corresponding electric drive for a coordinate measuring machine, in which the speed and/or the acceleration of the rotor is controlled or limited on the basis of the detected motor current, is known, for example, from DE 10 2006 003 362 A1.

The motor current of DC motors is usually detected by a shunt resistor in the motor line or by a Hall sensor and can additionally be redundantly detected in the central controller, with the result that redundant motor current measurement is possible with little outlay.

The electrically commutated DC machines (BLDCs) often used today usually have three phases, which are offset with respect to one another by 120°, wherein the motor current is detected in at least two of the three phases, preferably, however, in all three phases, in order to determine or to limit the torque of the drive. In this case, however, a technically complex transformation of the three phase currents is required for determining the torque.

Since the detection of the effective motor current is technically complex and complicated in the case of the multi-phase electrically commutated DC machines, most drives of this kind do not involve redundant detection of the motor current, with the result that correspondingly reliable measurement is not possible for safety-relevant applications.

Furthermore, in the case of a decentralized arrangement of the control unit, the electric drive is usually controlled by means of a digital bus system. For safe motor control, however, the detected motor currents have to be reliably transmitted to the central controller by means of the digital bus system, with the result that the transmission of the measurement value of the motor current to the central controller is generally associated with a high technical outlay.

SUMMARY OF THE INVENTION

It is therefore the object of the present invention to provide confirmation of the detected motor current for an electric drive with little technical outlay.

In accordance with a first aspect of the present invention, a method for checking an electrical variable of an electric machine of the type mentioned at the outset is therefore provided, said method having the steps of detecting a value of a drive current, which is fed to the electric drive for the purpose of driving the rotor, detecting a measurement value of an electrical input variable of the electric machine, determining a calculation value of the electrical input variable on the basis of the detected value of the drive current and of a performance model of the electric machine, and determining a comparison value on the basis of the detected measurement value and of the determined calculation value of the electrical input variable, in order to check the detected value of the drive current.

In accordance with a second aspect of the present invention, an apparatus for checking an electrical variable of an electric machine of the type mentioned at the outset is therefore provided, said apparatus having a first detection unit, which is associated with the electric drive and is configured to detect a value of the drive current, which is fed to the electric drive for the purpose of driving the rotor, a second detection unit, which is configured to detect a measurement value of the electrical input variable of the electric machine, a determination unit, which is configured to determine a calculation value of the electrical input variable on the basis of the detected drive current and of a performance model of the electric machine, and a checking unit, which is configured to determine a comparison value on the basis of the detected measurement value and of the determined calculation value of the electrical input variable, in order to check the detected value of the drive current.

Furthermore, a method for operating an electric machine is provided, said method having the steps of checking an electrical variable of the electric machine in accordance with the present invention and interrupting an electrical power supply of the electric drive if the comparison value exceeds a predefined threshold value.

Finally, an electric machine of the type mentioned at the outset having an apparatus for checking an electrical variable of the electric machine in accordance with the present invention is provided.

In accordance with the invention, a performance model of the electric machine is understood to mean an observation of the consumed and output powers taking into account the conservation of energy.

In accordance with the present invention, an electrical input variable of the electric machine is understood to mean an electrical input voltage or an electric input current of the entire electric machine, wherein the electrical input variable forms at least one electrical variable of the electrical power consumed by the electric machine.

The drive current, which is fed to the electric drive for the purpose of driving the rotor, is detected by the method according to the invention and the apparatus according to the invention for checking an electrical variable of the electric machine and the electrical input variable is calculated on the basis of the detected drive current and an observation of the electrical power consumed by the electric machine, with the result that the measured drive current can be confirmed by comparing the calculated value of the electrical input variable with the measurement value of the electrical input variable. The drive current can be checked metrologically by way of said comparison of the measured electrical input variable and the electrical input variable calculated on the basis of the drive current, with the result that additional redundancy can be provided with little technical outlay and the reliability of the motor current measurement can be increased thereby. The drive current is detected with a certain factor of uncertainty by the method according to the invention and the apparatus according to the invention and can be checked by the theoretical performance observation and the measurement of the electrical input variable by a second measurement value, with the result that the measured value of the drive current can be confirmed with little technical outlay.

A safe and reliable advancing force limitation for linear drives and a safe and reliable drive torque limitation can be achieved by the thus confirmed measurement of the motor current, with the result that a sufficient level of safety for personal protection or the like can be provided with little technical outlay.

Finally, confirming the motor current by way of the theoretical performance observation and the electrical input variable of the electric machine that can be measured externally with little technical outlay can significantly reduce the technical outlay with respect to reliable transmission of the confirmed motor current, since the measurement value can be confirmed in the central control unit by way of the performance model.

As a result of the fact that, in the method according to the invention for operating an electric machine, the electrical power supply of the electric drive is interrupted if the comparison value exceeds a predefined threshold value, an erroneous measurement of the drive current can be identified and the electric drive can be reliably switched off when the limitation of the advancing force or the limitation of the torque can no longer be reliably ensured. The reliable function and the safety of the electric machine can therefore be significantly increased.

The object of the present invention is therefore achieved in full.

It goes without saying that the preferred refinements of the method likewise form refinements of the apparatus or can be applied thereto.

In a preferred refinement, the electrical input variable is a total current consumed by the electric machine or an electrical variable corresponding to the total current consumed by the electric machine.

As a result, it is possible to detect an electrical variable that varies depending on the electrical power consumption of the electric machine with little technical outlay.

In this case, it is particularly preferable if an electrical voltage is detected at a measurement resistor of an electrical input line of the electric machine, in order to measure the total current consumed by the electric machine.

As a result, the total current consumed by the electric machine can be detected with little technical outlay.

It is furthermore preferable if the calculation value of the electrical input variable is calculated on the basis of a total voltage supplied to the electric machine.

As a result, the total electrical power consumed by the electric machine can be determined precisely.

In a preferred refinement, the performance model takes an electromotive force or an electromagnetic counterforce of the electric drive into account.

As a result, the electrical power consumed by the electric drive and not converted to movement energy can be taken into account, as a result of which the performance observation by means of the performance model is particularly precisely possible.

In this case, it is particularly preferable if a movement variable of the rotor is detected and the electromotive force or the electromagnetic counterforce is determined on the basis of a characteristic variable of the electric drive and of the detected movement variable.

As a result, the electromotive force or the electromagnetic counterforce can be determined independently of the electrical input variables.

In a particular refinement, the performance model takes an electrical power loss of a control unit of the electric machine into account.

As a result, additional electrical loads of the electric machine can be taken into account in the performance model, as a result of which the performance observation is more precisely possible.

In this case, it is particularly preferable if the electrical power loss of the control unit is determined when the rotor is stationary.

The electrical power loss of the control unit when the rotor is stationary is in this case determined by means of the power consumption when the rotor is stationary, wherein the electrical power consumed in moving operation is determined on the basis of the supply voltage of the electric machine and the power consumption is determined when the drive is stationary. As a result, the power consumption of the control unit can be reliably determined with little technical outlay.

It is furthermore preferable if the performance model takes a mechanical drive power of the electric drive into account. The mechanical drive power preferably results here from the effective drive current, which is consumed by the rotor of the electric drive and the electrical resistor of the rotor, which is given or can be determined in advance as the motor constant.

As a result, the mechanical drive power as a component of the performance model can be determined on the basis of the measured drive current with little technical outlay.

In a preferred refinement, the comparison value is determined on the basis of a difference value between the measurement value and the calculation value of the electrical input variable.

As a result, a deviation of the detected value of the drive current from an expected value of the drive current can be determined with little technical outlay, with the result that an erroneous measurement can be identified with little technical outlay.

It is furthermore preferable if the comparison value is determined on the basis of a sum of a plurality of the difference values.

As a result, smaller temporary differences between the measured drive current and the calculated comparison value can be balanced by the corresponding mean value formation, with the result that temporary differences do not lead to the electric machine being switched off.

It is furthermore preferable if the comparison value is determined on the basis of an integral of the difference value.

As a result, a continuous, precise mean value formation of the difference value can be performed.

It is particularly preferable here if a predefined value is subtracted from a value of the integral or a value of the sum.

As a result, a maximum limit value for the total difference between the drive current and the comparison value can be defined with little technical outlay, with the result that an error in the motor current detection can be reliably identified.

In a preferred refinement, the second detection unit for detecting the measurement value of the electrical input variable and the determination unit for determining the calculation value of the electrical input variable are connected in each case to a separate checking unit, wherein the checking units are each configured to independently determine the comparison value in order to independently check the detected value of the drive current. The two checking units in this case preferably exchange the measured and calculated data between themselves in order to provide the respective other checking unit with the required data.

As a result, the drive current can be checked independently, as a result of which the reliability of the checking of the drive current can be increased further.

In a preferred refinement, the separate checking units are connected in each case to a switching unit of the electric machine in order to interrupt the electrical power supply of the electric drive. In this case, the switching units of the electric machine are formed separately and can be actuated independently of one another.

As a result, in the event of an error in the motor current detection, the electric machine or the electric drive can be reliably and independently switched off.

Overall, reliable checking of the measurement of the drive current can be carried out by the present invention with little technical outlay, wherein the thus measured and checked drive current can be supplied to a central control unit with little technical outlay, since the checking takes places separately from the measurement of the drive current and the electrical input variable can be detected externally at the electrical power supply of the electric machine. The different electrical energies in the form of an energy conservation observation can be taken into account by means of the performance model and the physical variables of the individual energy components can be determined separately, with the result that the electrical input variable can be precisely calculated as reference.

It goes without saying that the aforementioned features and those yet to be explained below can be used not only in the combination specified in each case but also in other combinations or on their own, without departing from the scope of the present invention.

BRIEF DESCRIPTION OF THE DRAWINGS

Exemplary embodiments of the invention are illustrated in the drawing and will be explained in greater detail in the following description. In the drawing.

DESCRIPTION OF PREFERRED EMBODIMENTS

Figure 1:
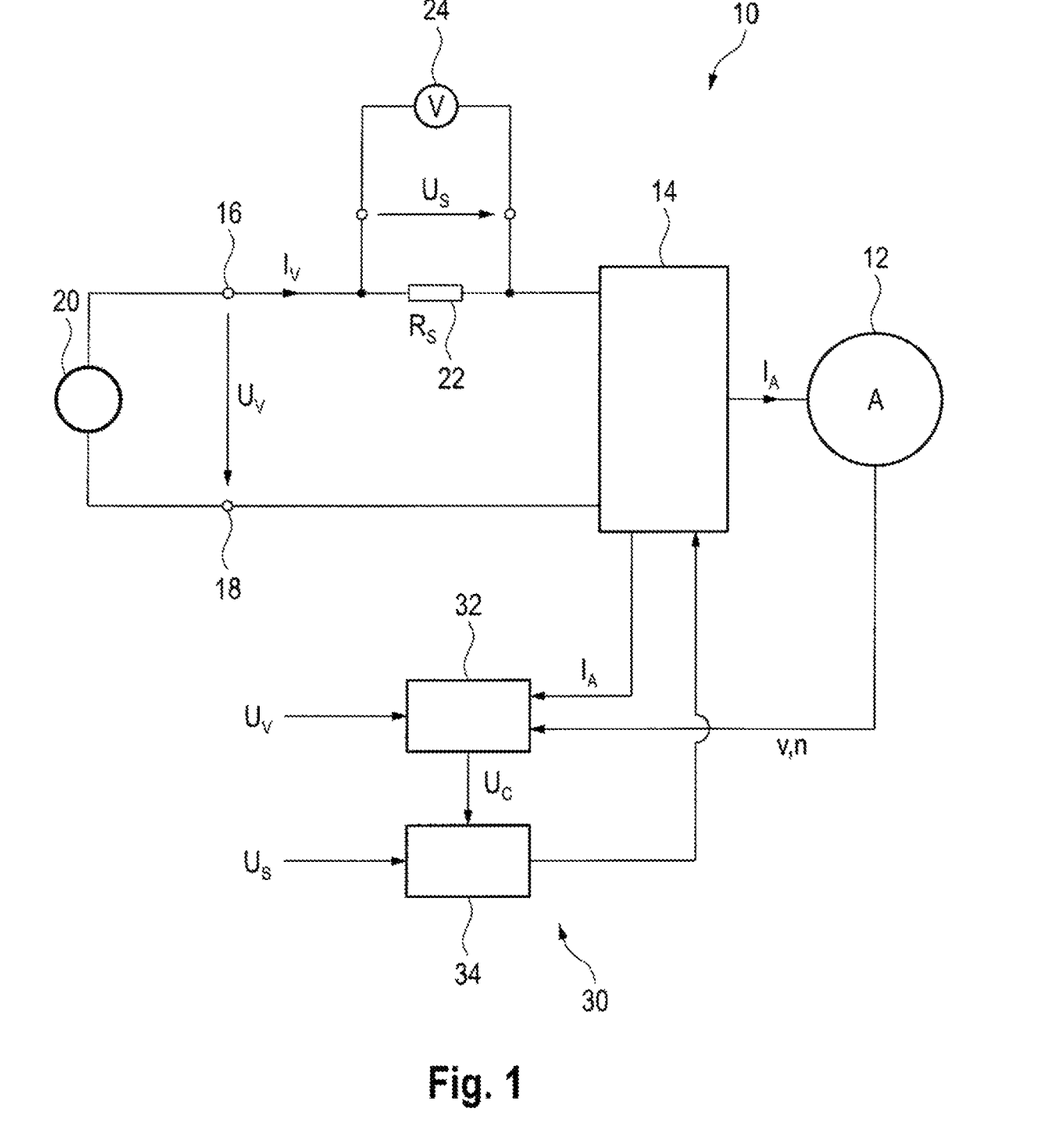
FIG. 1 shows a schematic illustration of an electric machine having a control unit for driving an electric drive and having an apparatus for checking an electrical variable of the electric machine.

FIG. 1 schematically illustrates an electric machine, which is generally denoted by 10. The electric machine 10 has an electric drive 12 and a control unit 14 for actuating or for energizing the electric drive 12. The electric drive 12 can generally be configured as a rotary motor or as a linear motor and generally has a fixed stator and a moving rotor, wherein, depending on the embodiment, the rotor provides a torque or a linear motor force. The control unit 14 is electrically connected to the stator of the electric drive 12 and actuates the electric drive 12 or energizes the electric drive 12 by means of a motor current $I_A$. The torque provided by the rotor or the motor force provided by the rotor is proportional to the motor current $I_A$, with the result that the torque or the motor force can be controlled or limited accordingly by way of the motor current $I_A$.

The control unit 14 is connected to electrical input connections 16, 18 of the electric machine 10 in order to electrically connect the control unit 14 to an external voltage source 20, which supplies an input voltage or a supply voltage $U_V$ to the input connections 16, 18. Depending on the drive power of the electric drive 12, the control unit 14 consumes an input current $I_V$, which forms a total consumed current $I_V$ of the electric machine 10. A measurement resistor 22 having an electrical resistance $R_S$ is arranged in an input line, which connects one of the electrical connections 16, 18 to the control unit 14, wherein a measurement voltage $U_S$ is dropped across the measurement resistor 22, said measurement voltage being detected by means of a voltmeter 24 in order to determine the total consumed current $I_V$.

An advancing force F of the rotor of the electric drive 12 or a torque M of the rotor is directly proportional to the motor current $I_A$ by way of a motor force constant or a torque constant. The motor current $I_A$ can be measured or detected by the control unit 14 or a separate ammeter and is available as a non-confirmed measurement value. If the advancing force F or the torque M are intended to be reliably determined or reliably limited with the aid of the motor current $I_A$, the measurement of the motor current $I_A$ has to be correspondingly confirmed by a further measurement, as is explained in more detail below.

The electric drive 12 can generally be configured as an electric linear motor, as a mechanically commutated DC motor or as a brushless electrically commutated DC motor (BLDC).

To confirm the detected motor current $I_A$, the electric machine 10 has an apparatus 30 for checking the motor current $I_A$ as the electrical variable of the electric machine 10. The apparatus 30 for checking the motor current $I_A$ has a determination unit 32, which determines a calculation value $U_C$ for the measurement voltage $U_S$ on the basis of the detected motor current $I_A$, of the input voltage $U_V$ and of a movement variable v, n of the rotor and on the basis of a performance model of the electric machine 10. The apparatus 30 for checking the motor current $I_A$ further has a checking unit 34, which compares the calculation value $U_C$ for the measurement voltage $U_S$ and the measurement value of the measurement voltage $U_S$ in order to check the detected value of the drive current $I_A$. The checking unit 34 outputs a comparison value between the calculation value $U_C$ and the measurement voltage $U_S$ and can, on the basis of the comparison value, switch off the electric machine 10 in general or switch off the control unit 14, as is illustrated in FIG. 1.

The apparatus 30 for checking the motor current $I_A$ can be configured as an integrated circuit in a chip in the form of a microcontroller.

Since the determination unit 32 determines the calculation value $U_C$ from the motor current $I_A$ and from the input voltage $U_V$ and the movement variable v, n of the rotor, that is to say on the basis of measurement variables that are independent of the measured measurement voltage $U_S$, the calculation value $U_C$ is independent of the measurement voltage $U_S$, with the result that two redundant measurement variables can be compared and the measurement of the motor current $I_A$ can therefore be confirmed.

The performance model of the electric machine 10 is based on the principle of the conservation of energy, in that an electrical input power $P_V$ of the electric machine 10 is identical to a sum of an output mechanical drive power $P_{mech}$, a power loss $P_M$ of the motor and a power loss $P_E$ of the electronic components of the electric machine 10, as is shown in formula 1:

$$P_V = P_{mech} + P_M + P_E \quad \text{(formula 1)}$$

The electrical input power $P_V$ can be calculated with the aid of the measurement resistor 22 and the input voltage $U_V$ according to formula 2:

$$P_V = U_V * I_V \quad \text{(formula 2)}$$

Alternatively, the input voltage $U_V$ and the total current $I_V$ can be detected by way of a central control unit in the region of the input connections 16, 18. Furthermore, the total current $I_V$ or the measurement voltage $U_S$ can be determined by a separate measurement unit at any position of the electrical connection line of the control unit 14, said separate measurement unit supplying the corresponding measurement results to the central control unit by means of a digital bus line.

The electrical power loss $P_E$ or the self-consumption power $P_E$ of the electronic components of the electric machine 10, such as of the control unit 14, for example, can be measured in advance when the rotor is stationary, wherein the total consumed current $I_V$ is then identical to the electric current $I_E$ consumed by the electronic components. The electrical power loss $P_E$ of the electronic components results from formula 3:

$$P_E = U_V * I_E \quad \text{(formula 3)}$$

The power loss of the motor $P_M$ results from the motor current $I_A$ that flows through the rotor or an armature of the rotor, wherein the armature of the rotor has an armature resistance $R_A$. The power loss of the motor $P_M$ results from formula 4:

$$P_M = R_A \cdot I_A^2 \quad \text{(formula 4)}$$

wherein the armature resistance $R_A$ is a known motor constant and the motor current $I_A$ can be measured by the control unit 14 or an associated ammeter, as explained above.

In addition to the power loss of the motor $P_M$ and the power loss $P_E$ of the electronic components, the actual motor power or the mechanical advancing power $P_{Mech}$ also has to be taken into account, which consists of a component proportional to the speed of rotation or speed and of a component proportional to the torque or to the force. The component $U_{EMK}$ proportional to the speed of rotation or speed corresponds to the electromotive force (back EMF) and can be calculated as a movement variable of the electric drive 12 using a motor constant $K_{EMK}$, which is known or can be measured for each electric drive, and the speed v of the rotor or a speed of rotation n of the rotor. The maximum speed of an electric drive 12 results from the fact that the electromagnetic counter-voltage $U_{EMK}$ reaches a value of the maximum available voltage, that is to say the link circuit voltage.

$$U_{EMK} = K_{EMK} * v; \quad U_{EMK} = K_{EMK} * n \quad \text{(formula 5)}$$

The component proportional to the torque or to the force corresponds to the motor current $I_A$. The actual motor power or the mechanical advancing power $P_{Mech}$ therefore results from formula 6:

$$P_{mech} = U_{EMK} * I_A \quad \text{(formula 6)}$$

The following thus results for the performance model from formula 1:

$$U_V * I_V = U_V * I_E + R_A * I_A^2 K_{EMK} * v * I_A \quad \text{(formula 7)}$$

For the static case, where the rotor is stationary and therefore no mechanical power is output, the following results for the motor current:

$$I_A \sqrt{U_V \cdot (I_V - I_E)/R_A} \quad \text{(formula 8)}$$

and for the dynamic case, taking into account the mechanically output power $P_{Mech}$, the following results for the total current $I_V$:

$$I_V = (U_V I_E + R_A \cdot I_A^2 + K_{EMK} \cdot v \cdot I_A)/U_V \quad \text{(formula 9)}$$

wherein the calculation value $U_C$ can be calculated by way of the resistance $R_S$ of the measurement resistor 22:

$$U_C = R_S * I_V \quad \text{(formula 10)}$$

The measured motor current $I_A$ can be independently or redundantly checked by way of the comparison value between the calculation value $U_C$ and the measurement voltage $U_S$, since the calculation value $U_C$ is based on the motor current $I_A$ and independent variables and the measurement voltage $U_S$ can be detected metrologically at the measurement resistor 22. The simple measurement of the motor current $I_A$ can therefore be confirmed by way of the performance model and can be used for safety-relevant applications and variables, such as limiting the advancing force, for example.

If the difference value between the calculation value $U_C$ and the measurement voltage $U_S$ exceeds a predefined value, the measurement of the motor current $I_A$ is erroneous, with the result that the measured motor current $I_A$ can no longer be used to confirm the advancing force or to confirm the drive torque. In this case, the electric machine 10 can generally be switched off by way of the control unit 14 or a separate switch or contactor.

Since usually smaller differences often briefly arise between the calculation value $U_C$ and the measurement voltage $U_S$, the difference value can be averaged and the difference value can be summed or integrated for the purpose of identifying an error. Furthermore, a predefined value can be subtracted regularly or continuously from the calculated sum value or calculated integral value, with the result that an error in the motor current detection is identified only after reaching a limit value.

Alternatively thereto, it is also possible to form a moving average value with a tolerance range or the like.

It goes without saying that the total current $I_V$ can also be measured by way of the measurement resistor 22, provided a plurality of control units 14 are connected via the measurement resistor 22 to the input connection 16.

Figure 2:
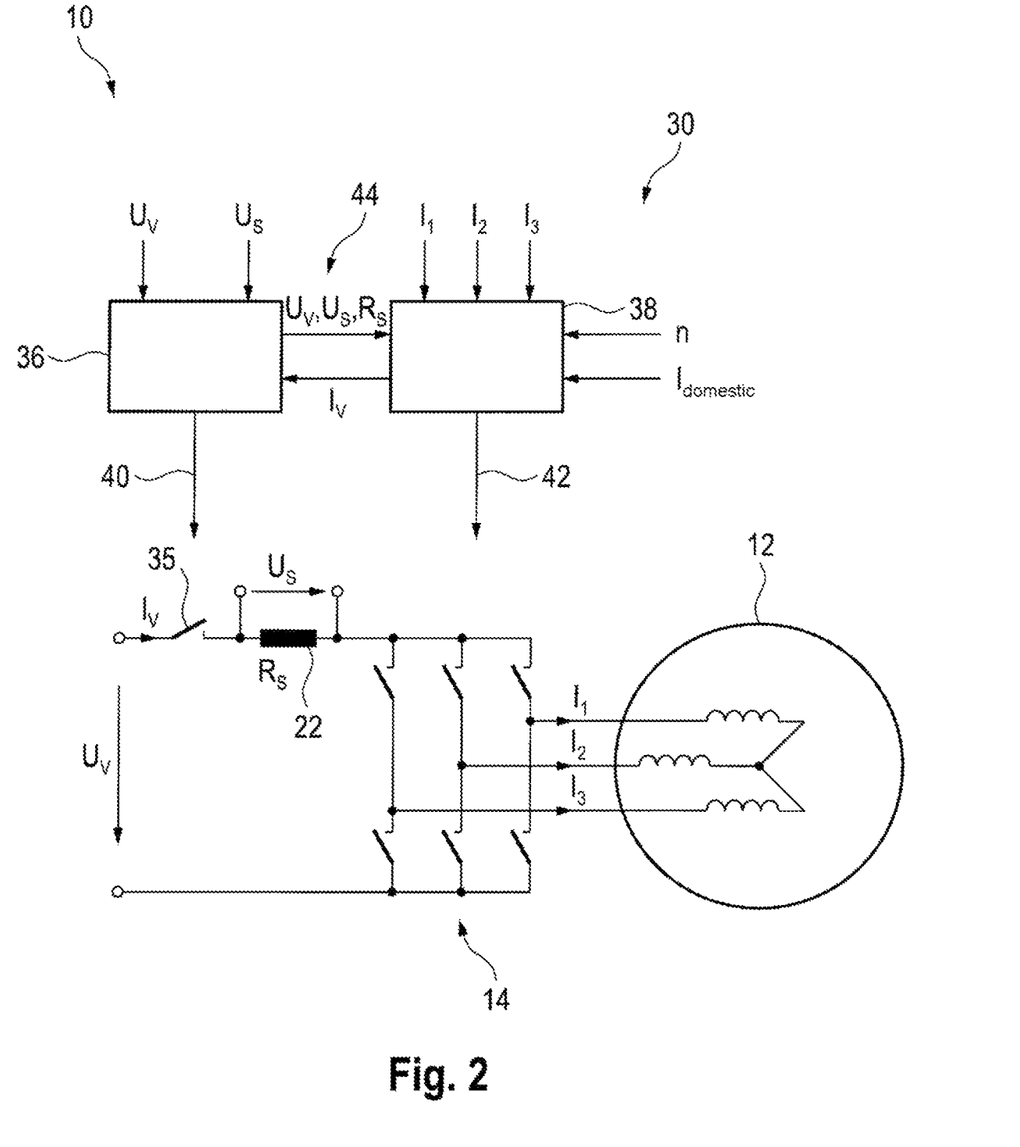
FIG. 2 shows a schematic detail drawing of an embodiment of the electric machine from FIG. 1.

FIG. 2 schematically illustrates an embodiment of the electric machine 10. Identical elements are denoted by identical reference numerals, with only the special features being explained here.

In this embodiment, the electric drive 12 is configured as an electrically commutated DC machine that has three phases U, V, W. The control unit 14 is configured as a three-phase inverter, which has three half-bridges each having two controllable switches, in order to convert the input voltage $U_V$ to a three-phase AC voltage. The control unit 14 is connected to the three phases of the electric drive 12 by way of three connection lines and accordingly supplies three phase currents $I_1$, $I_2$, $I_3$, in order to drive the rotor of the electric drive 12.

The electric machine 10 furthermore has a first checking unit 36 and a second checking unit 38, which are configured separately and are each preferably configured as an integrated circuit in the form of a microcontroller. The first checking unit 36 and the second checking unit 38 together form the apparatus 30.

The measurement voltage $U_S$ and the input voltage $U_V$ are supplied to the first checking unit 36 as measured input variables. The input voltage $U_V$, the resistance $R_S$ of the measurement resistor 22 and the measurement voltage $U_S$ as input variables from the first checking unit are supplied as input variables to the second checking unit 38. Furthermore, the second checking unit receives measurement values of the three phase currents $I_1$, $I_2$, $I_3$ and the speed of rotation n and the predetermined current consumption $I_E$ as further input variables. The second checking unit 38 calculates the total current $I_V$ as explained above with reference to formula 9 on the basis of the input variables and furthermore calculates the calculation value $U_C$ by means of the resistance value $R_S$ of the measurement resistor 22 and compares the measured measurement voltage $U_S$ with the thus determined calculation value $U_C$. The second checking unit 38 is connected to the control unit 14 by way of a signal line 42. If the difference value between the calculation value $U_C$ and the measured measurement voltage $U_S$ exceeds a predefined threshold value, a corresponding switch-off signal is transmitted to the control unit 14 via the signal line 42 and the controllable switches of the half-bridges are opened, in order to disconnect the electric drive 12.

The second checking unit 38 transmits the calculated total current $I_V$ to the first checking unit 36 and the first checking unit 36 determines the calculation value $U_C$ with reference to the resistance value $R_S$ of the measurement resistor 22 and compares the calculation value $U_C$ with the measured measurement voltage $U_S$ independently of the second checking unit 38. The first checking unit is connected to a switch 35 in the connection line by way of a signal line 40. If the difference value between the measurement voltage $U_S$ and the calculation value $U_C$ exceeds a predefined threshold value, a corresponding switch-off signal is transmitted to the controllable switch 35 and the controllable switch 35 is accordingly opened.

The first checking unit 36 and the second checking unit 38 are preferably physically separated from one another and exchange the calculated and measured data by way of a bus system 44 or a security bus system 44, as illustrated in FIG. 2. Further redundancy can be established by the physical separation, with the result that, in the event of an error, there are two independent evaluations and switch-off means for the electric drive 12.

Figure 3:
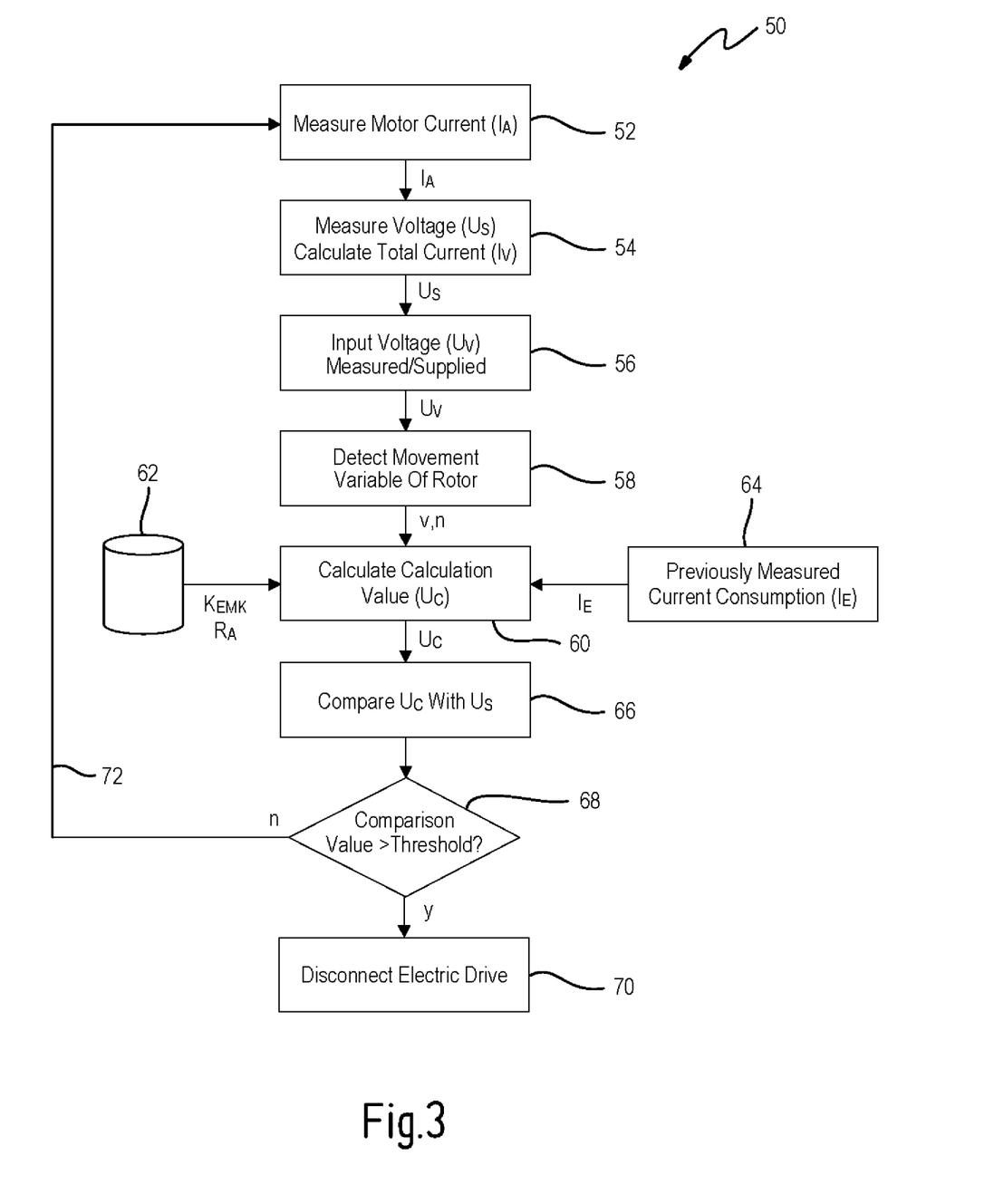
FIG. 3 shows a schematic flow chart of a method for checking an electrical variable of the electric machine.

FIG. 3 shows a schematic flow chart of a method for checking an electrical variable of the electric machine 10. In FIG. 3, the method is generally denoted by 50.

The method 50 begins with the measurement of the motor current $I_A$, as is shown in step 52, wherein the measurement of the motor current $I_A$ as explained above has to be confirmed for safety-relevant applications. In step 54, the measurement voltage $U_S$ across the measurement resistor 22 is measured and the total current $I_V$ is determined. In step 56, the input voltage $U_V$ is measured or, in the event of the input voltage being stable and constant, is supplied. In step 58, the movement variable of the rotor is detected, said movement variable being the rotor speed v or the speed of rotation n depending on the embodiment of the electric drive 12.

In step 60, the calculation value $U_C$ is determined on the basis of the performance model of the electric machine 10. For calculating the calculation value $U_C$, motor constants such as KEMK and $R_A$ are provided by a storage means 62 and the previously measured current consumption $I_E$ is provided, as is shown in 64. In step 66, the calculation value $U_C$ is compared with the measured measurement voltage $U_S$. In step 68, the thus determined comparison value is compared with a threshold value and, if the comparison value is greater than the threshold value, in step 70, the electric machine 10 is isolated from the electrical power supply or the electric drive 12 is disconnected. If the comparison value is lower than the predefined threshold value, the method 50 returns to step 52, as is shown by the feedback loop 72, and detects the motor current $I_A$.

Figure 4:
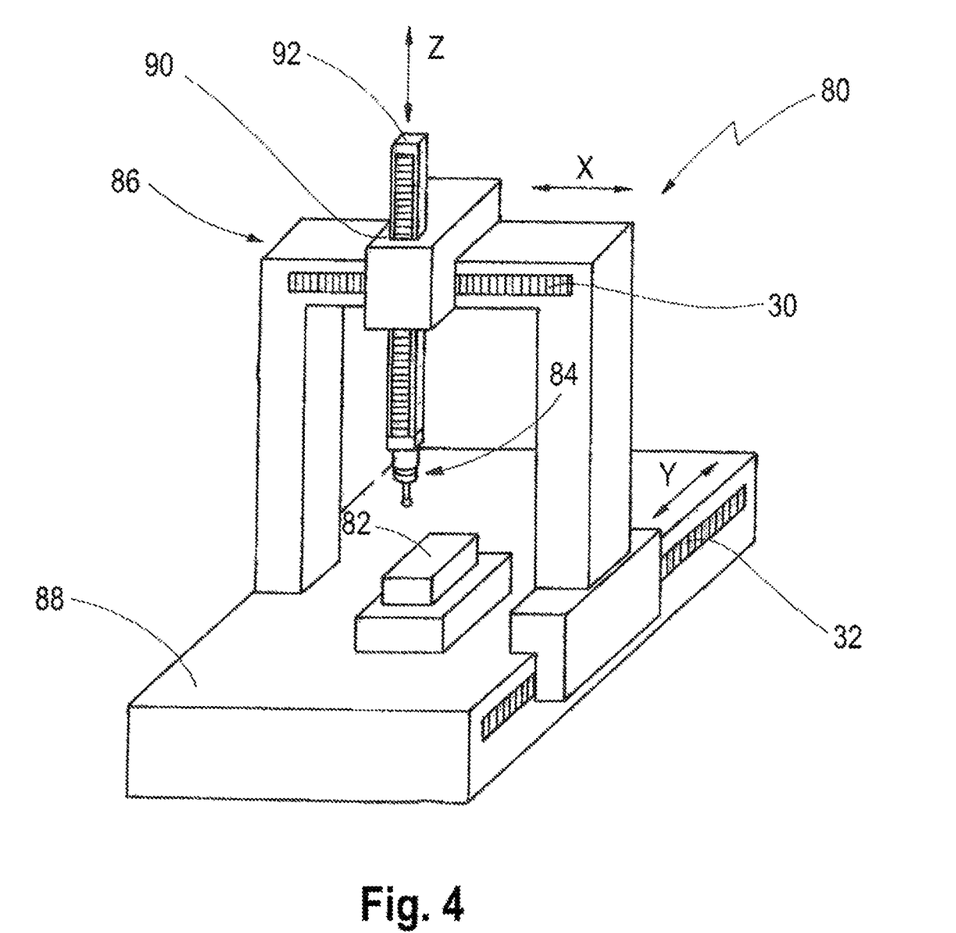
FIG. 4 shows a schematic illustration of an embodiment of a coordinate measuring machine as an exemplary application for the electric machine from FIG. 1.

It goes without saying that steps 52 to 58 can also be carried out in parallel or in any other desired order and that the method 50 can proceed continuously. FIG. 4 illustrates a coordinate measuring machine as an exemplary application for the electric machine 10, said coordinate measuring machine generally being denoted by 80. The coordinate measuring machine 80 serves to measure a workpiece 82 and has a tactile sensor 84 for measuring the workpiece 82. The coordinate measuring machine 80 comprises a carrier structure 86, which can be moved relative to a base plate 88 in the Y-direction. The carrier structure 86 furthermore has a slide 90 and a sleeve 92, which are each mounted in a movable manner and can be moved by means of electric drives. The carrier structure 86 and the slide 90 and the sleeve 92 can be driven by means of an electric machine 10 in accordance with the present invention. The drive forces of the individual elements can be safely limited by confirming the motor current $I_A$.

What is claimed is:

1. A method for checking a drive current of an electric machine of a coordinate measurement device, wherein the electric machine includes an electric drive having a stator and a rotor and wherein the drive current is fed to the electric drive to drive the rotor, the method comprising:
   detecting a measurement value of an electrical input variable of the electric machine, wherein:
   the electrical input variable is aa total current consumed by the electric machine or (ii) an electrical variable corresponding to the total current consumed by the electric machine and
   the total current consumed by the electric machine includes current consumed by other electrical components in the electrical machine in addition to current consumed by the electric drive;
   detecting a value of the drive current;

determining a calculation value of the electrical input variable based on (i) the detected value of the drive current and (ii) a performance model of the electric machine; and determining a comparison value based on a difference value between (i) the measurement value of the electrical input variable and (ii) the calculation value of the electrical input variable, in order to check the detected value of the drive current.

2. The method of claim 1, wherein the calculation value of the electrical input variable is calculated based also on a total voltage supplied to the electric machine.

3. The method of claim 1, wherein the performance model takes into account an electromagnetic force of the electric drive.

4. The method of claim 3, further comprising:
detecting a movement variable of the rotor and
determining the electromagnetic force based on (i) characteristic variable of the electric drive and (ii) the detected movement variable.

5. The method of claim 1, wherein:
the electric machine includes a control unit and
the performance model takes into account an electrical power loss of the control unit.

6. The method of claim 5, further comprising determining the electrical power loss of the control unit when the rotor is stationary.

7. The method of claim 1, wherein the performance model takes into account a mechanical drive power of the electric drive.

8. The method of claim 1, further comprising:
determining a plurality of difference values that includes the difference value,
wherein the comparison value is determined based on a sum of the plurality of difference values.

9. The method of claim 8, wherein a predefined value is subtracted from a value of the sum.

10. The method of claim 1, wherein the comparison value is determined based on an integral of the difference value over time.

11. The method of claim 10, wherein a predefined value is subtracted from a value of the integral.

12. The method of claim 1, further comprising interrupting the drive current fed to the electric drive in response to the comparison value exceeding a predefined threshold value.

13. A method for checking a drive current supplied to an electric machine of a coordinate measurement device, wherein the electric machine comprises an electric drive having a stator and a rotor, wherein the drive current is fed to the electric drive in order to drive the rotor, and wherein the electric machine obeys a conservation of energy principle, the method comprising:
detecting a first measurement value that represents an instantaneous value of the drive current;
detecting a second measurement value that represents a total current consumed by the electric machine, including by components of the electric machine other than the electric drive;
determining a calculation value of the total current consumed by the electric machine based on (i) the first measurement value and (ii) a performance model of the electric machine, wherein the performance model is configured to model consumed power and output power of the electric machine and wherein the performance model takes into account the conservation of energy principle, and
comparing the second measurement value and the calculation value in order to check the instantaneous value of the drive current.

14. An apparatus for checking a drive current of an electric machine of a coordinate measurement device, wherein the electric machine includes an electric drive having a stator and a rotor and wherein the drive current is fed to the electric drive in order to drive the rotor, the apparatus comprising:
a first detection unit, that is associated with the electric drive and is configured to detect a value of the drive current;
a second detection unit, which that is configured to detect a measurement value of an electrical input variable of the electric machine, wherein:
the electrical input variable is aa total current consumed by the electric machine or (ii) an electrical variable corresponding to the total current consumed by the electric machine and
the total current consumed by the electric machine includes current consumed by other electrical components in the electrical machine in addition to current consumed by the electric drive;
a determination unit that is configured to determine a calculation value of the electrical input variable based on (i) the detected value of the drive current and (ii) a performance model of the electric machine; and
a checking unit, that is configured to determine a comparison value based on a difference value between (i) the detected measurement value of the electrical input variable and (ii) the determined calculation value of the electrical input variable in order to check the detected value of the drive current.

15. The apparatus of claim 14, wherein:
the checking unit includes at least two separate checking units,
each of the second detection unit and the determination unit is connected to the at least two separate checking units, and
each of the at least two separate checking units is configured to independently determine the comparison value in order to independently check the detected value of the drive current.

16. The apparatus of claim 15, further comprising:
a switching unit configured to interrupt an electrical power supply path to the electric drive,
wherein each of the at least two separate checking units is connected to the switching unit in order to interrupt the drive current to the electric drive.

17. The apparatus of claim 14, further comprising a switching unit configured to interrupt an electrical power supply path to the electric drive based on the comparison value.

18. The apparatus of claim 17, wherein the switching unit is configured to interrupt the electrical power supply path to the electric drive in response to the comparison value exceeding a predefined threshold value.

19. The apparatus of claim 18, further comprising:
at least one of (i) one or more integrated circuits and/or (ii) one or more microcontrollers,
wherein the one or more integrated circuits and/or the one or more microcontrollers implement the first detection unit, the second detection unit, the determination unit, and the checking unit.

20. The apparatus of claim 14, further comprising:
at least one of (i) one or more integrated circuits and/or (ii) one or more microcontrollers, wherein the one or more integrated circuits and/or the one or more microcontrollers implement the first detection unit, the second detection unit, the determination unit, and the checking unit.

* * * * *

UNITED STATES PATENT AND TRADEMARK OFFICE
CERTIFICATE OF CORRECTION

PATENT NO. : 11,489,466 B2
APPLICATION NO. : 15/848282
DATED : November 1, 2022
INVENTOR(S) : Guenter Grupp Page 1 of 1

It is certified that error appears in the above-identified patent and that said Letters Patent is hereby corrected as shown below:

In the Claims

| | |
|---|---|
| Claim 1, Column 10, Line 59 | "aa" should be --(i) a-- |
| Claim 4, Column 11, Line 18 | "(i)" should be --(i) a-- |
| Claim 12, Column 11, Line 67 | "principle," should be --principle;-- |
| Claim 14, Column 12, Line 10 | "unit, that" should be --unit that-- |
| Claim 14, Column 12, Line 13 | "unit, which that" should be --unit that-- |
| Claim 14, Column 12, Line 16 | "aa" should be --(i) a-- |
| Claim 14, Column 12, Line 28 | "unit, that" should be --unit that-- |

Signed and Sealed this
Twenty-fourth Day of January, 2023

Katherine Kelly Vidal
*Director of the United States Patent and Trademark Office*